(12) United States Patent
Jo et al.

(10) Patent No.: US 11,363,711 B2
(45) Date of Patent: Jun. 14, 2022

(54) PRINTED CIRCUIT BOARD INCLUDING ELECTROCONDUCTIVE PATTERN AND ELECTRONIC DEVICE INCLUDING PRINTED CIRCUIT BOARD

(71) Applicant: Samsung Electronics Co., Ltd., Suwon-si (KR)

(72) Inventors: Jaehoon Jo, Suwon-si (KR); Sehyun Park, Suwon-si (KR); Sumin Yun, Incheon (KR); Myunghun Jeong, Daejeon (KR); Jehun Jong, Seoul (KR); Jinwoo Jung, Seoul (KR); Jaebong Chun, Suwon-si (KR); Eunseok Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 327 days.

(21) Appl. No.: 16/200,401

(22) Filed: Nov. 26, 2018

(65) Prior Publication Data

US 2019/0166686 A1    May 30, 2019

(30) Foreign Application Priority Data

Nov. 28, 2017    (KR) .................. KR10-2017-0160993

(51) Int. Cl.
*H01Q 1/22* (2006.01)
*H01Q 1/38* (2006.01)
(Continued)

(52) U.S. Cl.
CPC ......... *H05K 1/0242* (2013.01); *H01Q 1/2283* (2013.01); *H01Q 1/38* (2013.01);
(Continued)

(58) Field of Classification Search
CPC .... H05K 1/0242; H05K 1/024; H05K 1/0298; H05K 2201/09672; H05K 2201/10098;
(Continued)

(56) References Cited

U.S. PATENT DOCUMENTS

2008/0042917 A1 * 2/2008 Seki .................. H01Q 1/38
343/767
2008/0129511 A1 6/2008 Yuen et al.
(Continued)

FOREIGN PATENT DOCUMENTS

JP      2009206781 A    9/2009
KR  10-2014-0059552 A   5/2014
(Continued)

OTHER PUBLICATIONS

Supplementary European Search Report in connection with European Application No. 18883133.3 dated Aug. 24, 2020, 9 pages.
(Continued)

*Primary Examiner* — Dimary S Lopez Cruz
*Assistant Examiner* — Michael M Bouizza

(57) ABSTRACT

According to various embodiments of the present disclosure, an electronic device may include: a housing including a first plate and a second plate; a printed circuit board having a first surface and a second surface; and a communication circuit arranged inside the housing. The printed circuit board may include: a plurality of insulating layers laminated on each other between the first surface and the second surface; an antenna element arranged in a first region above the second surface of the printed circuit board or between a first pair of insulating layers of the printed circuit board, when seen from above the second surface of the printed circuit board; and a plurality of first electroconductive patterns arranged in a second region that at least surrounds one surface of the first region. Various embodiments may be possible.

20 Claims, 24 Drawing Sheets

(51) Int. Cl.
*H05K 1/02* (2006.01)
*H01Q 15/00* (2006.01)
*H01Q 21/28* (2006.01)
*H01Q 9/04* (2006.01)
*H01Q 21/00* (2006.01)
*H01Q 21/08* (2006.01)

(52) U.S. Cl.
CPC ....... *H01Q 9/0457* (2013.01); *H01Q 15/0086* (2013.01); *H01Q 21/0093* (2013.01); *H01Q 21/08* (2013.01); *H01Q 21/28* (2013.01); *H05K 1/024* (2013.01); *H05K 1/0298* (2013.01)

(58) Field of Classification Search
CPC ....... H05K 2201/09781; H05K 1/0271; H05K 1/09; H05K 1/0218; H01Q 15/0086; H01Q 21/28; H01Q 9/0457; H01Q 21/0093; H01Q 21/08; H01Q 1/38; H01Q 1/2283; H01Q 1/243; H01Q 9/0407; H01Q 9/0414; H01Q 21/065; H01Q 1/523; H01Q 15/006
See application file for complete search history.

(56) References Cited

U.S. PATENT DOCUMENTS

| | | |
|---|---|---|
| 2011/0050533 A1 | 3/2011 | Cho et al. |
| 2012/0119969 A1* | 5/2012 | MacDonald ......... H01Q 1/3233 343/841 |
| 2012/0229343 A1 | 9/2012 | Sudo et al. |
| 2014/0097995 A1 | 4/2014 | McKinzie, III |
| 2014/0125541 A1 | 5/2014 | Hong et al. |
| 2014/0354513 A1 | 12/2014 | Nair et al. |
| 2015/0022416 A1 | 1/2015 | Sasaki et al. |
| 2015/0207233 A1 | 7/2015 | Kim et al. |
| 2016/0233178 A1 | 8/2016 | Lamy et al. |
| 2017/0033062 A1 | 2/2017 | Liu et al. |
| 2017/0069958 A1 | 3/2017 | Ko et al. |
| 2020/0076055 A1* | 3/2020 | Jeon .......................... H01Q 1/38 |

FOREIGN PATENT DOCUMENTS

| | | |
|---|---|---|
| KR | 10-2015-0087595 A | 7/2015 |
| KR | 10-2017-0030196 A | 3/2017 |

OTHER PUBLICATIONS

International Search Report regarding Application No. PCT/KR2018/013933, dated Feb. 25, 2019, 3 pages.

* cited by examiner

PRINTED CIRCUIT BOARD INCLUDING ELECTROCONDUCTIVE PATTERN AND ELECTRONIC DEVICE INCLUDING PRINTED CIRCUIT BOARD

CROSS-REFERENCE TO RELATED APPLICATION

The present application is related to and claims benefit under 35 U.S.C. § 119(a) of Korean patent application filed on Nov. 28, 2017 in the Korean Intellectual Property Office and assigned Serial number 10-2017-0160993, the entire disclosure of which is hereby incorporated by reference.

BACKGROUND

1. Field

Various embodiments of the present disclosure relate to a printed circuit board including an electroconductive pattern and an electronic device including the same.

2. Description of Related Art

The above information is presented as background information only to assist with an understanding of the present disclosure. No determination has been made, and no assertion is made, as to whether any of the above might be applicable as prior art with regard to the present disclosure.

To meet the demand for wireless data traffic having increased since deployment of 4G communication systems, efforts have been made to develop an improved 5G or pre-5G communication system. Therefore, the 5G or pre-5G communication system is also called a 'Beyond 4G Network' or a 'Post LTE System'. The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In the case of a 5G communication system that uses an ultra-high frequency band, the path of radio waves may undergo a large loss. For example, if radio waves emitted through an antenna face a metal, the radio waves may be scattered by the metal, and this may degrade the performance of the antenna.

There may exist various structures of antenna modules for emitting radio waves, and, for example, a communication device employing a printed circuit board (PCB) including multiple layers may be considered.

If no metal is arranged on a part of the layers of the PCB, the PCB may be bent due to a difference in thermal expansion coefficient between the layers when the PCB is processed in a high-temperature environment during a process of forming the PCB, for example, and this may increase the defect ratio of the communication device.

According to various embodiments of the present disclosure, an electronic device may include a PCB including an antenna element and a first electroconductive pattern.

SUMMARY

According to various embodiments of the present disclosure, an electronic device may include: a housing including a first plate and a second plate facing in a direction opposite to the first plate; a printed circuit board having a first surface facing the first plate and having a second surface facing the second plate; and a communication circuit arranged inside the housing. The printed circuit board may include: a plurality of insulating layers laminated on each other between the first surface and the second surface; an antenna element arranged in a first region above the second surface of the printed circuit board or between a first pair of insulating layers of the printed circuit board, when seen from above the second surface of the printed circuit board; and a plurality of first electroconductive patterns arranged in a second region that at least surrounds one surface of the first region between a first pair of directly adjacent layers of the insulating layers of the printed circuit board or between a second pair of directly adjacent layers of the insulating layers, when seen from above the second surface of the printed circuit board. The antenna element may be physically separated from the first electroconductive patterns. The communication circuit may be electrically connected to the antenna element and may transmit/receive a frequency of 20 GHz to 100 GHz.

According to various embodiments of the present disclosure, a printed circuit board having a plurality of insulating layers laminated on each other may include: at least one antenna element arranged on a surface of the printed circuit board or between the insulating layers of the printed circuit board; a plurality of first electroconductive patterns arranged along an outer periphery of the antenna element between the insulating layers of the printed circuit board; and a communication circuit arranged to be electrically connected to the antenna element and to be able to transmit/receive a frequency of 20 GHz to 100 GHz.

According to an embodiment of the present disclosure, an electroconductive pattern is formed on a layer of a PCB of a communication device included in an electronic device such that the PCB can be prevented from bending at a high-temperature environment, and the defect ratio of the communication device can be reduced accordingly.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code"

includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document. Those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 17, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Figure 1:
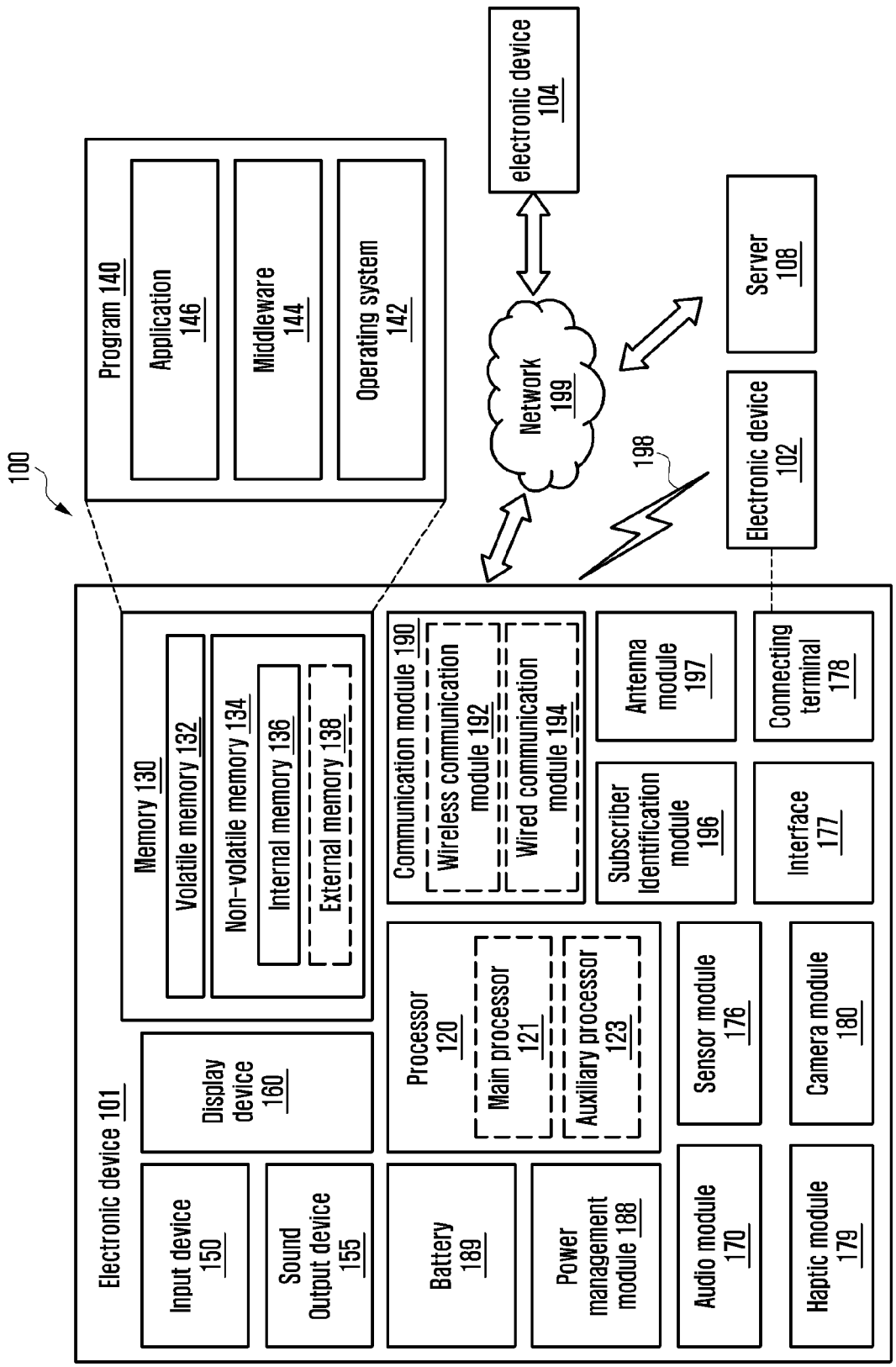
FIG. 1 is a block diagram illustrating an electronic device inside a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in nonvolatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the nonvolatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
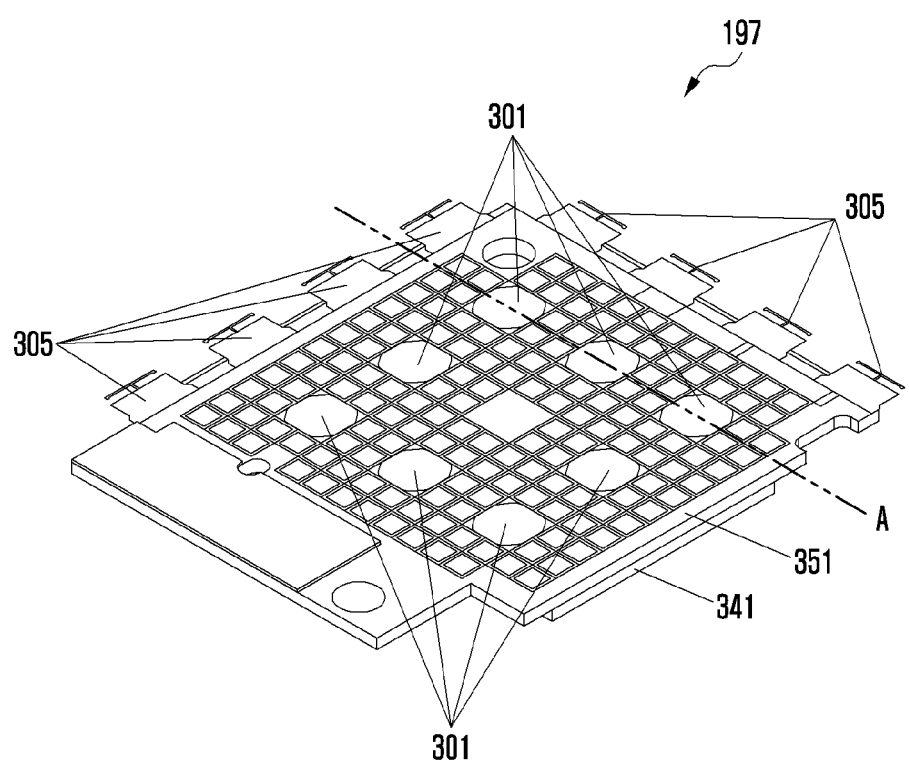
FIG. 2 is a diagram illustrating the structure of a PCB according to an embodiment of the present disclosure.

FIG. 2 is a diagram illustrating the structure of a communication device according to an embodiment of the present disclosure.

Referring to FIG. 2, an antenna module 197 according to the present disclosure may include a plurality of antenna elements 301 and 305, a PCB 351, or a communication circuit 341 (for example, RFIC). The plurality of antenna elements may be arranged on the PCB 351 in an array type, for example.

According to various embodiments of the present disclosure, the PCB 351 may be structured to have a plurality of insulating layers laminated on each other. An electroconductive member including layers may be formed and laminated between the plurality of insulating layers, and at least a part of the electroconductive member may operate as antenna elements 301 and 305.

According to an embodiment, a plurality of antenna elements 301 may be arranged on the PCB 351 at a designated interval. For example, the electronic device 101 may apply an RF signal to the antenna elements 301 through a feeding line such that radio waves in a specific frequency band may be transmitted through the antenna elements 301.

According to an embodiment, the at least one antenna element 301 may be electrically connected to a communication circuit 341 included in the PCB or arranged on a surface of the PCB. The at least one antenna element 301 may receive an RF signal applied from the communication circuit 341 and may transmit/receive a signal having a frequency band (20 GHz to 100 GHz) having an ultra-high frequency band.

Figure 3:
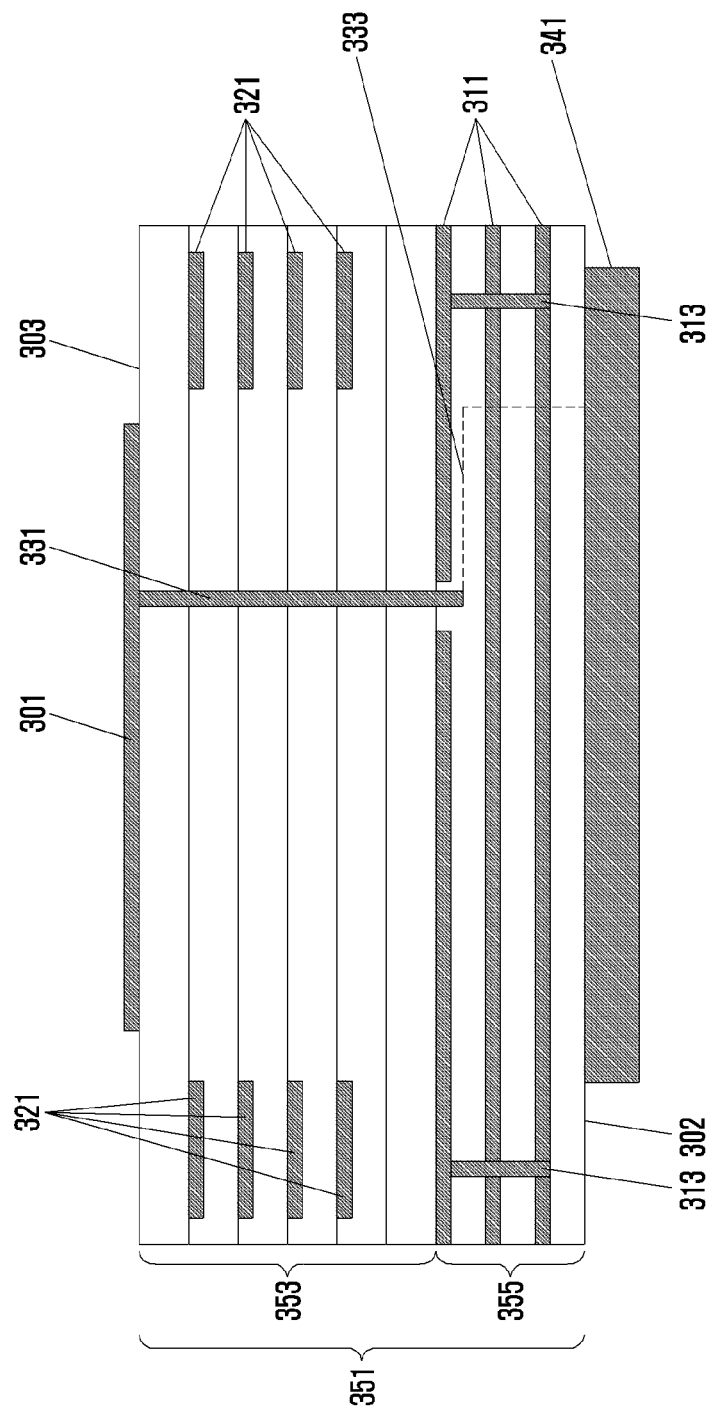
FIG. 3 is a diagram illustrating an embodiment of a section of the PCB disclosed in FIG. 2 taken in direction A.

FIG. 3 is a diagram illustrating an embodiment of a section of the PCB disclosed in FIG. 2 taken in direction A. Although it has been described in connection with an embodiment of the present disclosure that a plurality of antenna elements are arranged on the PCB in an array type, FIG. 3 illustrates only a section of the PCB corresponding to one antenna element for convenience of description.

According to various embodiments of the present disclosure, the PCB 351 includes a plurality of insulating layers laminated between the first surface 302 and the second surface 303; an antenna element 301 arranged above the second surface 303 when seen from above the second surface 303; and a plurality of first electroconductive patterns 321 arranged to surround a surface of the antenna element 301 when seen from above the second surface 303 of the PCB 351. The antenna element 301 may be physically separated from the first electroconductive patterns 321.

According to an embodiment, the communication circuit 341 (for example, RFIC) may be positioned on the first surface 302 of the PCB. For example, the communication circuit 341 may be electrically connected to the antenna element 301 and may transmit/receive a frequency of 20 GHz to 100 Gz.

According to various embodiments of the present disclosure, the antenna element 301 may be formed have a first area on the second surface 303 of the PCB. The antenna element 301 may be electrically connected to the communication circuit 341 through a feeding line 331.

According to an embodiment, the first electroconductive patterns 321 may be arranged along the outer periphery of the antenna element 301 between the insulating layers of the PCB 351. For example, provided that the antenna element 301 is formed on the second surface 303 of the PCB, a plurality of first electroconductive patterns 321 may be formed so as to surround the outer periphery of the antenna element 301 from the insulating layer positioned below the second surface 303.

According to an embodiment, the first electroconductive patterns 321 may have the same shape. For example, the shape of the first electroconductive patterns 321 may include at least one selected from a square shape, a rectangular shape, and a circular shape.

According to an embodiment, the electric path length of the first electroconductive patterns 321 may be shorter than the electric path length of the antenna element 301. For example, the electric path length of the first electroconductive patterns 321 may be determined on the basis of the $\lambda/4$ value ($\lambda$, is the wavelength of radio waves emitted through the antenna element), and the electric path length of the antenna element 301 may be determined on the basis of the $\lambda/2$ value. According to an embodiment, the electric path length of the antenna element 301 may be a multiple of $\lambda/2$. For example, the electric path length of the first electroconductive patterns 321 may be approximately equal to or smaller than half the electric path length of the antenna element 301.

According to an embodiment, the first electroconductive patterns 321 may be electrically insulated from the ground layer 311. For example, at least one insulating layer may be included between the layer on which the first electroconductive patterns 321 are arranged and the layer on which the ground layer 311 is arranged.

According to an embodiment, the first electroconductive patterns 321 may have different shapes. According to an embodiment, the first electroconductive patterns 321 may be formed to surround the antenna element 301 at different intervals.

According to an embodiment, the first electroconductive patterns 321 are arranged inside the PCB, and the thermal expansion coefficient of the PCB becomes uniform accordingly, making it possible to lessen or prevent bending of the PCB due to high-temperature heat when the PCB is formed.

According to an embodiment, the plurality of insulating layers included in the PCB 351 may include two layer regions 353 and 355. For example, the antenna element 301 and the plurality of first electroconductive patterns 321 may be arranged in the first layer region 353. As another example, at least one ground layer 311 may be arranged in the second layer region 355. For example, ground layers 311 may be arranged on a plurality of layers in the second layer region 355. The ground layers 311 arranged on respective layers may be connected to each other through vias 313, for example.

According to an embodiment, the communication circuit 341 may be arranged on the first surface 302. The communication circuit 341 may be electrically connected to the antenna element 301 through a feeding line 331. The feeding line 331 may be connected to the communication circuit 341 through an inner wire of the PCB inside the second layer region 355. For example, the feeding line 331 and the communication circuit 341 may be connected through a PCB via 333 inside the second layer region 355.

According to an embodiment, the communication circuit 341 may apply an RF signal to the antenna element 301 through the feeding line 331 and the PCB via 333. The communication circuit 341 and the second layer region 355 may be coupled through soldering (for example, ball soldering).

Figure 4:
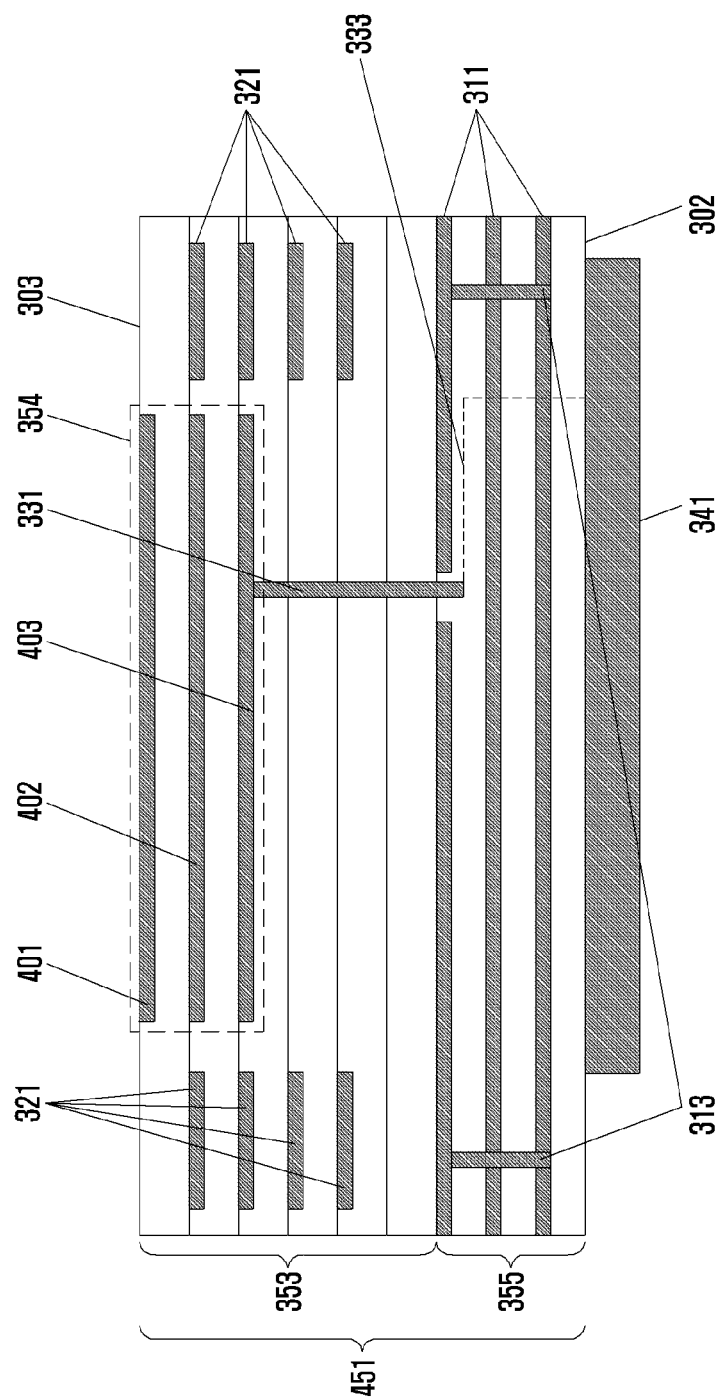
FIG. 4 is a diagram illustrating the structure of a PCB including a plurality of antenna elements.

FIG. 4 is a diagram illustrating the structure of a PCB including a plurality of antenna elements.

Referring to FIG. 4, the PCB 451 may include a plurality of antenna elements 401, 402, and 403 in the first region 354 in order to improve the radio wave emission bandwidth or the gain. For example, the PCB 451 may include three antenna elements in the first region 354. According to an embodiment, the first region 354 may be a region of the PCB 451 in which antenna elements are arranged.

According to an embodiment, provided that the first antenna element 401 is arranged on a layer including the second surface 303 of the PCB, the other antenna elements 402 and 403 may be arranged on a layer of the first layer region 353 other than the layer on which the first antenna element 401 is arranged so as to overlap when seen from above the second surface 303.

Although FIG. 4 illustrates only a case in which a plurality of antenna elements 401, 402, and 403 are arranged overlappingly on respective layers that continuously range from the layer including the second surface 303 toward the first surface 302, at least one layer may be arranged between the layers on which the antenna elements 401, 402, and 403 are arranged, respectively, according to an embodiment. For example, an antenna element 401 may be arranged on the layer including the second surface 303, and another antenna element 402 may be arranged on the fourth layer counting from the layer including the second surface 303 toward the first surface 302. For example, at least one layer (three layers in the present example) having no antenna element arranged thereon may be arranged between layers having antenna elements arranged thereon.

The structure of the PCB disclosed in FIG. 4 may be identical or similar to that of the PCB disclosed in FIG. 3 except for the difference in the number of antenna elements.

Figure 5:
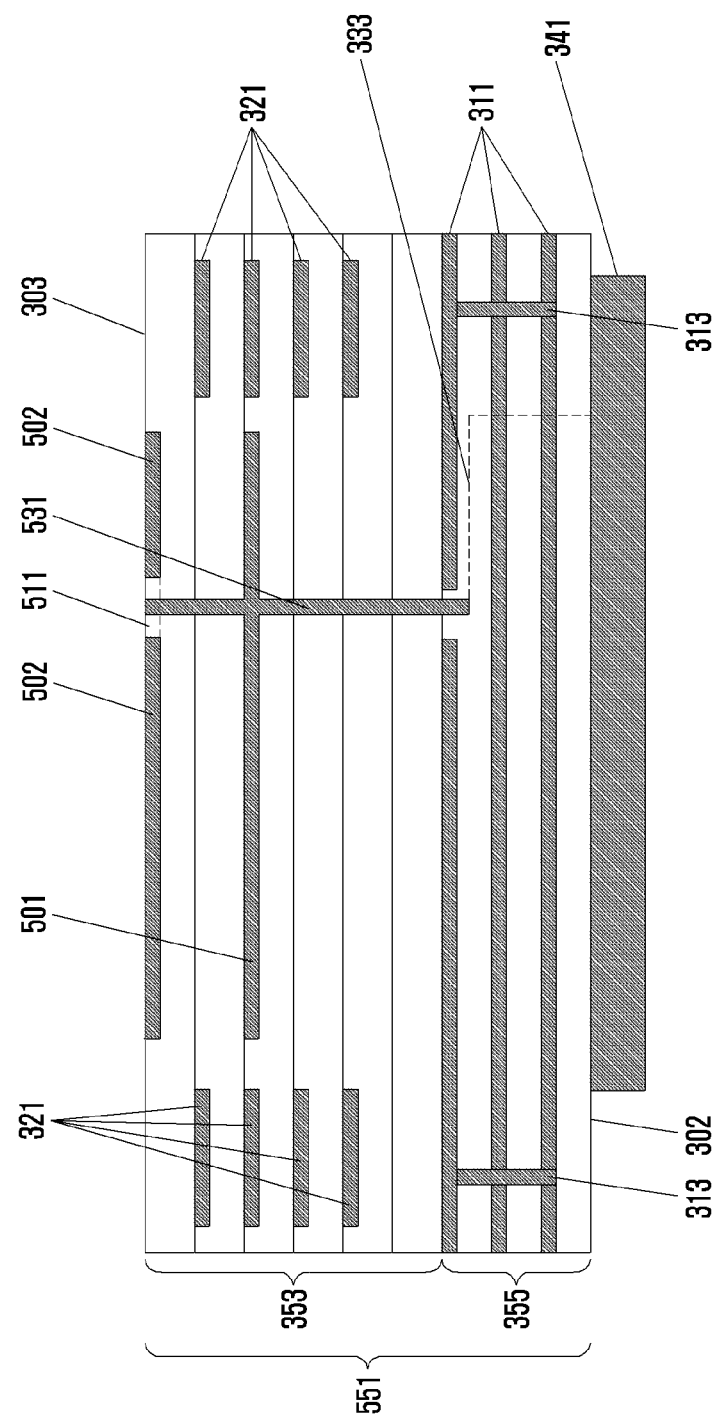
FIG. 5 is a diagram illustrating the structure of a PCB including a feeding test portion.

FIG. 5 is a diagram illustrating the structure of a PCB including a feeding test portion.

Referring to FIG. 5, the PCB 551 may have a first antenna element 501 and a second antenna element 502 arranged on different layers. For example, the PCB 551 may include a layer, which includes no antenna element, between layers on which first antenna elements 501 or second antenna elements 502 are arranged. According to an embodiment, a feeding line 531 may be formed to extend to the layer including the second surface 303. For example, the feeding line 531 may be exposed to the second surface 303 of the PCB 551, and the user may bring a testing probe into a contact with the feeding line 531 exposed to the second surface 303 of the PCB so as to test the connection between the feeding line 531 and the communication circuit 341. According to an embodiment, the second antenna element 502 arranged on the layer including the second surface 303 may include a hole 511 for exposing the feeding line 531 to the second surface 303 of the PCB 551.

The structure of the PCB 551 disclosed in FIG. 5 may be identical or similar to that of the PCB disclosed in FIG. 3 and FIG. 4 except for the number and arrangement of the antenna elements 501 and 502 or the fact that the feeding line 531 may be exposed to the second surface 303.

Figure 6:
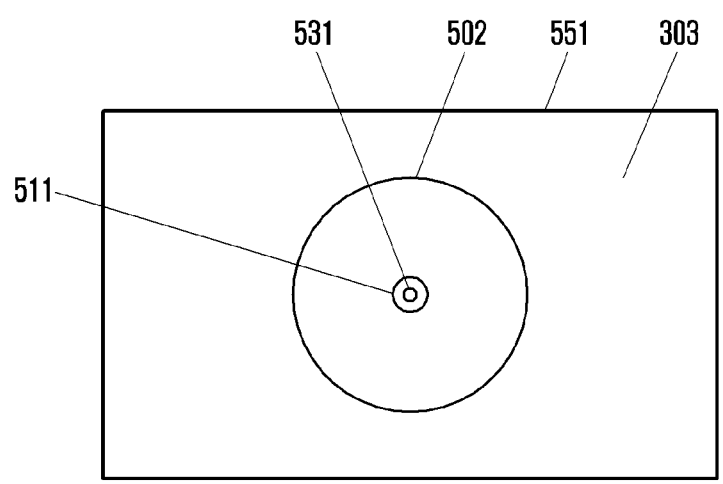
FIG. 6 is a diagram illustrating the structure of a PCB including a feeding test portion when seen from above the top surface of the PCB.

FIG. 6 is a diagram illustrating the structure of a PCB including a feeding test portion when seen from above the top surface of the PCB. For example, FIG. 6 may be a diagram illustrating the PCB 551 of FIG. 5 when seen from above the second surface 303 thereof.

When the PCB 551 disclosed in FIG. 5 is seen from above the second surface 303, the second antenna element 502 having a hole 511 may be arranged on a layer including the second surface 303 of the PCB.

According to an embodiment, a hole 511 may be formed in the second antenna element 502, and the feeding line 331 may be exposed toward the second surface 303 of the PCB through the hole 511. The user can bring a measurement probe into a contact with the feeding line 531 exposed to the top surface, and can determine whether the connection between the communication circuit 341 and the feeding line has a defect or not.

Figure 7:
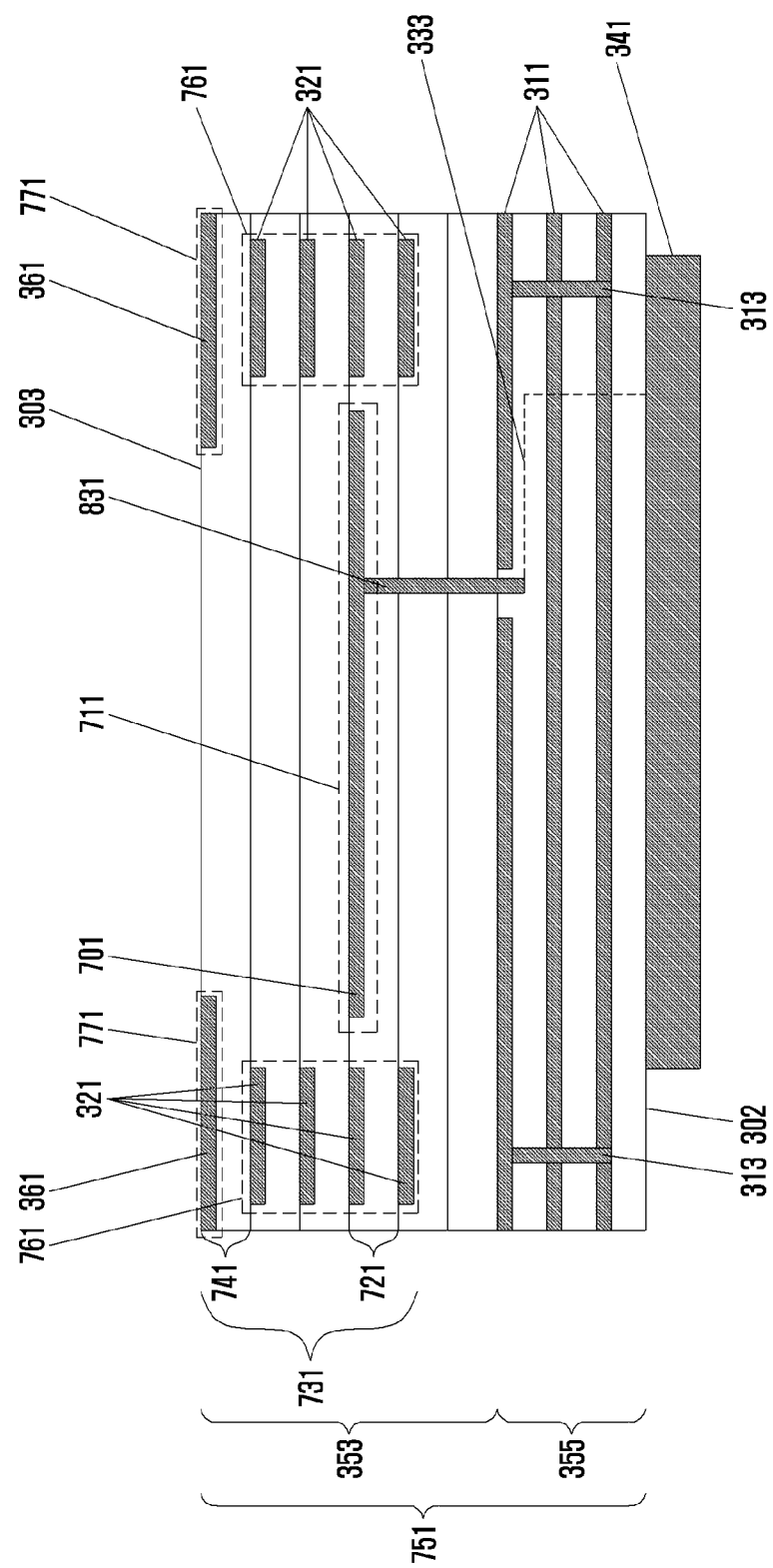
FIG. 7 is a diagram illustrating the structure of a PCB including a second electroconductive pattern.

FIG. 7 is a diagram illustrating the structure of a PCB including a second electroconductive pattern.

Referring to FIG. 7, the PCB 751 may include a plurality of insulating layers 353 and 355 laminated on each other between the first surface 302 and the second surface 303. According to an embodiment, the PCB 751 may include, when seen from above the second surface 303 of the PCB 751, an antenna element 701 arranged in a first region 711 above the second surface 303 of the PCB 751 or between a first pair 721 of insulating layers of the PCB 751.

According to an embodiment, the PCB 751 may include, when seen from above the second surface 303 of the PCB 751, a plurality of first electroconductive patterns 321 arranged in a second region 761 that surrounds a surface of the first region 711 between a first pair 721 of directly adjacent layers of insulating layers of the PCB 751 or between a second pair 731 of directly adjacent layers of the insulating layers.

According to an embodiment, the PCB 751 may include, when seen from above the second surface 303 of the PCB 751, a plurality of second electroconductive patterns 361 arranged in a third region 771, which overlaps with the second region, and which surrounds at least a part of the first region 711, on the second surface 303 or between a third pair 741 of directly adjacent layers of the insulating layers.

According to an embodiment, the communication circuit 341 may be electrically connected to the antenna element 701 and may transmit/receive a frequency of 20 GHz to 100 GHz.

According to an embodiment, when the antenna element 701 is arranged inside the PCB 751, no electroconductive material may be included between the first region 711 and the second pair 731 of directly adjacent layers of the insulating layers, where radio waves are emitted through the antenna element 701. According to an embodiment, at least a part of the span between the first region 711 and the second pair 731 of the insulation layers, which includes no electroconductive material, may be formed as an opening. For example, a hole may penetrate from the insulating layer of the second surface 303 to the first region 711 in which the antenna element 701 is arranged, thereby forming an opening.

According to an embodiment, a plurality of second electroconductive patterns 361 may be arranged (or formed) on the layer including the second surface 303 of the first layer region 353 or on at least some layers (for example, between insulating layers) other than the layer including the second surface 303. The plurality of second electroconductive patterns 361 may be arranged along the outer periphery of the antenna element 701 (or along holes formed along the outer periphery of the antenna element) at a designated interval or at non-uniform intervals.

According to an embodiment, the plurality of second electroconductive patterns 361 may be arranged to overlap with the second region 761 when seen from above the second surface 303 of the PCB 751.

According to an embodiment, the third region 771 in which the second electroconductive patterns 361 are arranged may at least partially overlap with the first region 711 or may surround at least a part of the first region 711 when seen from above the second surface 303 of the PCB 751. According to an embodiment, the second electroconductive patterns 361 may improve the gain value of radio waves emitted through the PCB 751 or the frequency band thereof.

According to an embodiment, the second electroconductive patterns 361 may include an artificial magnetic conductor (AMC). The second electroconductive patterns 361 may be formed as patterns having a specific periodicity, or may be formed as patterns having non-periodicity.

According to an embodiment, the electric path length of the second electroconductive patterns 361 may be shorter than the electric path length of the antenna element 701 and longer than the electric path length of the first electroconductive patterns 321. For example, the electric path length of the antenna element 701 may be approximately $\lambda/2$ (or an integer multiple of the $\lambda/2$ value); the electric path length of the first electroconductive patterns 321 may be $\lambda/8$; and the electric path length of the second electroconductive patterns 361 may be $\lambda/4$.

According to an embodiment, the plurality of second electroconductive patterns 361 may have various shapes. For example, the second electroconductive patterns 361 may have a square shape, a rectangular shape, a circular shape, a square ring shape, a rectangular ring shape, or a circular ring shape. According to an embodiment, the second electroconductive patterns 361 may have different shapes.

According to an embodiment, provided that the second electroconductive patterns 361 have a ring shape, the first electroconductive patterns 321 may at least partially overlap with the second electroconductive patterns 361 when seen from above the second surface 303. The first electroconductive patterns 321, the ground layer 311, or the communication circuit 341 disclosed in FIG. 7 may be identical or similar to the first electroconductive patterns, the ground layer, or the communication circuit disclosed in FIG. 3.

Figure 8:
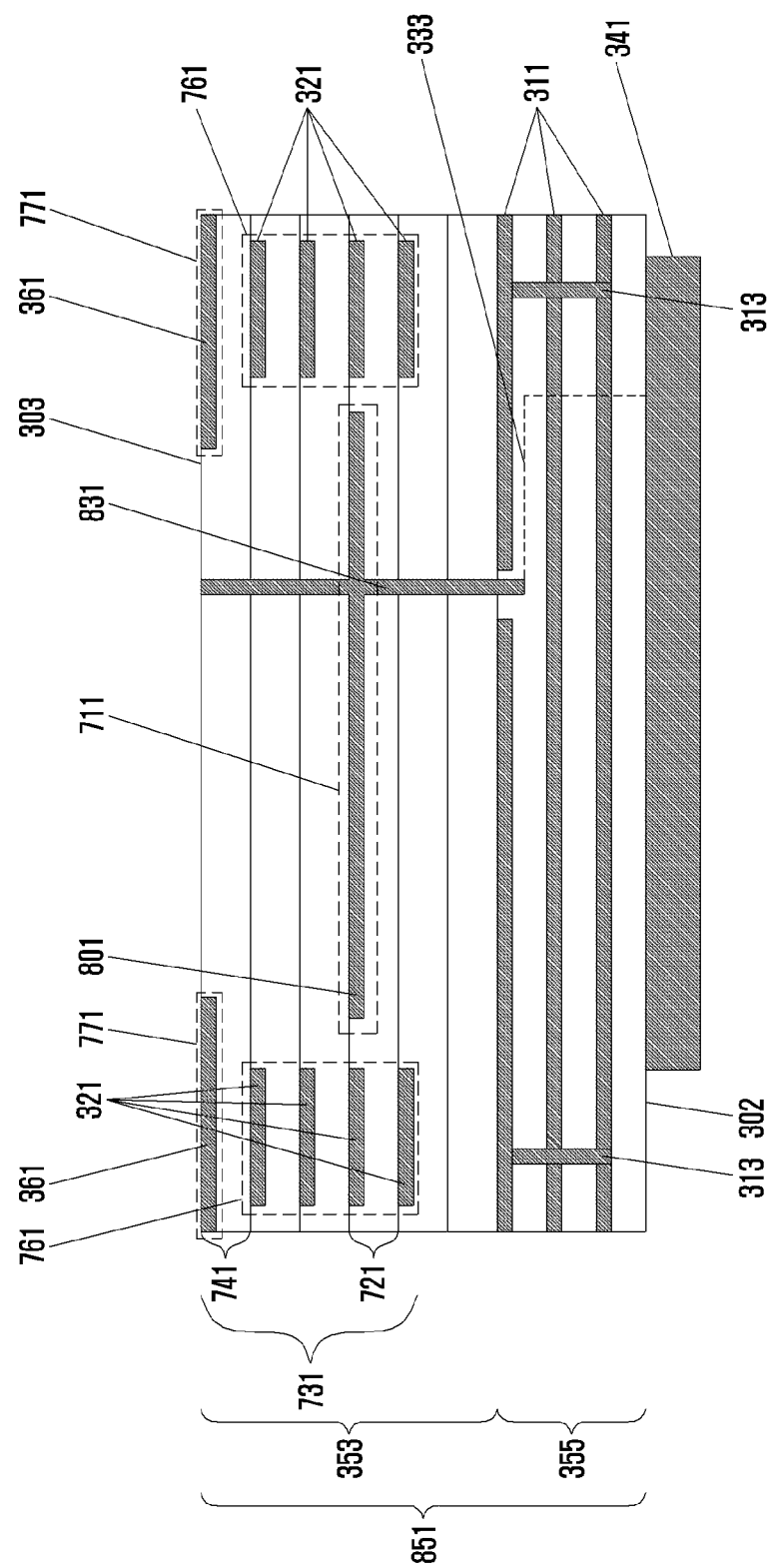
FIG. 8 is a diagram illustrating the structure of a PCB including a second electroconductive pattern and a feeding test portion.

FIG. 8 is a diagram illustrating the structure of a PCB including a second electroconductive pattern and a feeding test portion.

Referring to FIG. 8, a feeding test portion for determining whether the connection between the communication circuit 341 and the feeding line 831 has a defect or not may be added to the PCB structure disclosed in FIG. 7.

According to an embodiment, the feeding line 831 may be formed to extend to the layer including the second surface 303. In this case, the user can bring a probe into a contact with the feeding line 831, which extends to be exposed to the outer portion of the PCB 851, and can determine whether the connection between the communication circuit 341 and the feeding line 831 has a defect or not. According to an embodiment, provided that the PCB 851 has an opening formed therein by a cutout between the first region 711 and the second pair 731 of directly adjacent layers of the insulating layers, the feeding line 831 may not extend to the layer including the second surface 303, and the feeding line may instead extend to the layer on which the antenna element 801 is arranged.

The structure of the PCB 851 disclosed in FIG. 8 may be identical or similar to that of the PCB disclosed in FIG. 7 except that the feeding line 831 may be exposed to the second surface 303.

Figure 9:
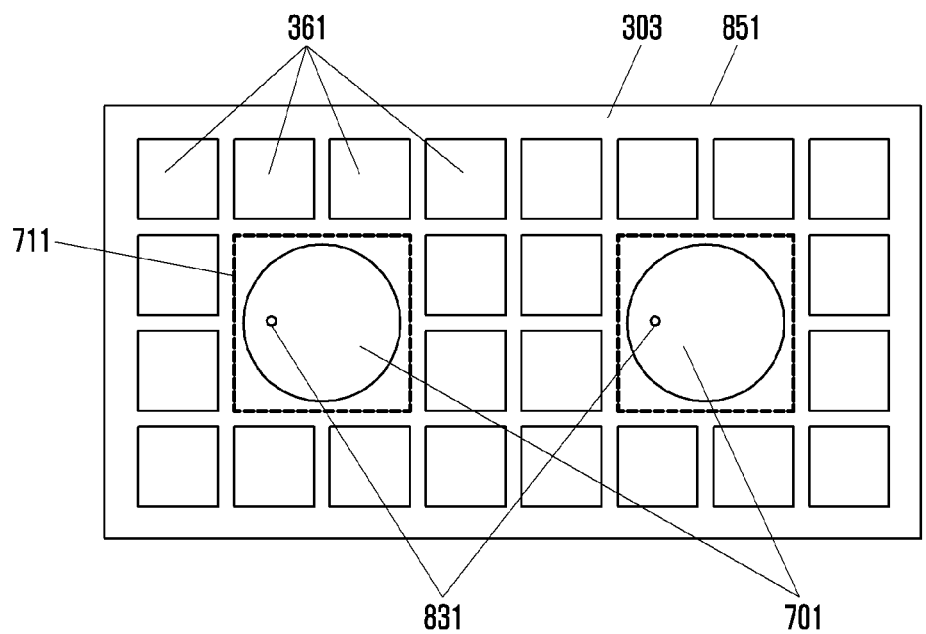
FIG. 9 is a diagram illustrating a PCB according to the present disclosure when seen from above the top surface thereof.

FIG. 9 is a diagram illustrating a PCB according to the present disclosure when seen from above the top surface thereof.

Referring to FIG. 9, there is illustrated a case in which the PCB 851 has two antenna elements 701 formed thereon. The antenna elements 701 can emit radio waves at a designated frequency, and it can thus be considered that FIG. 9 illustrates a PCB 851 having two antenna elements arranged in an array type.

According to an embodiment, one antenna element 701 may have a plurality of second electroconductive patterns 361 along the outer periphery of the antenna element 701. Referring to FIG. 9, there is illustrated a case in which twelve second electroconductive patterns 361 having square shapes are formed at a uniform interval along the outer periphery of one antenna element 701.

According to an embodiment, an antenna element 701 may be formed on the same layer with a plurality of second electroconductive patterns 361. For example, the antenna element 701 and the plurality of second electroconductive patterns 361 may both be formed on the layer including the second surface 303 of the PCB 851.

According to an embodiment, the antenna element 701 may be formed on a layer below the layer including the second surface 303. The plurality of second electroconductive patterns 361 may be arranged on the layer including the second surface 303. In this case, no electroconductive material may be included between the first region 711 and the second pair of directly adjacent layers of the insulating layers, or an opening may be formed therebetween, for the purpose of radio wave emission through the antenna element 701.

According to an embodiment, the PCB 851 may include a feeding test portion. The feeding test portion may be exposed to the outside of the layer to which the feeding line 831 extends, and on which the antenna element 701 is arranged.

Although not illustrated in FIG. 9, first electroconductive patterns 321 may be formed to overlap with the second electroconductive patterns 361, when seen from above the second surface 303 of the PCB 851, from the layer below the layer on which the second electroconductive patterns 361 are formed.

Figure 10:
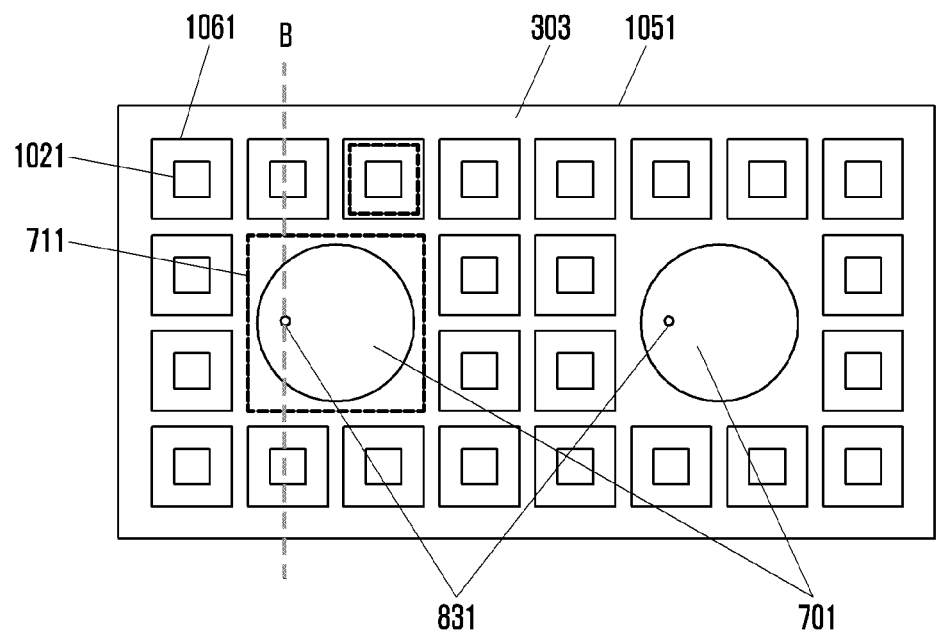
FIG. 10 is a diagram illustrating a PCB having ring-shaped second electroconductive patterns when seen from above the second surface thereof.

FIG. 10 is a diagram illustrating a PCB having ring-shaped second electroconductive patterns when seen from above the second surface thereof.

According to an embodiment, the second electroconductive patterns 1061 may have ring shapes. If the second electroconductive patterns 1061 have ring shapes, the outermost area of the second electroconductive patterns 1061 may be larger than the outermost area of the first electroconductive patterns 1021. For example, the electric path length of the second electroconductive patterns 1061 may be longer than the electric path length of the first electroconductive patterns 1021.

The structure of the PCB 1051 disclosed in FIG. 10 may be identical or similar to that of the PCB disclosed in FIG. 9 except that the second electroconductive patterns 1061 may be formed in ring shapes.

Figure 11:
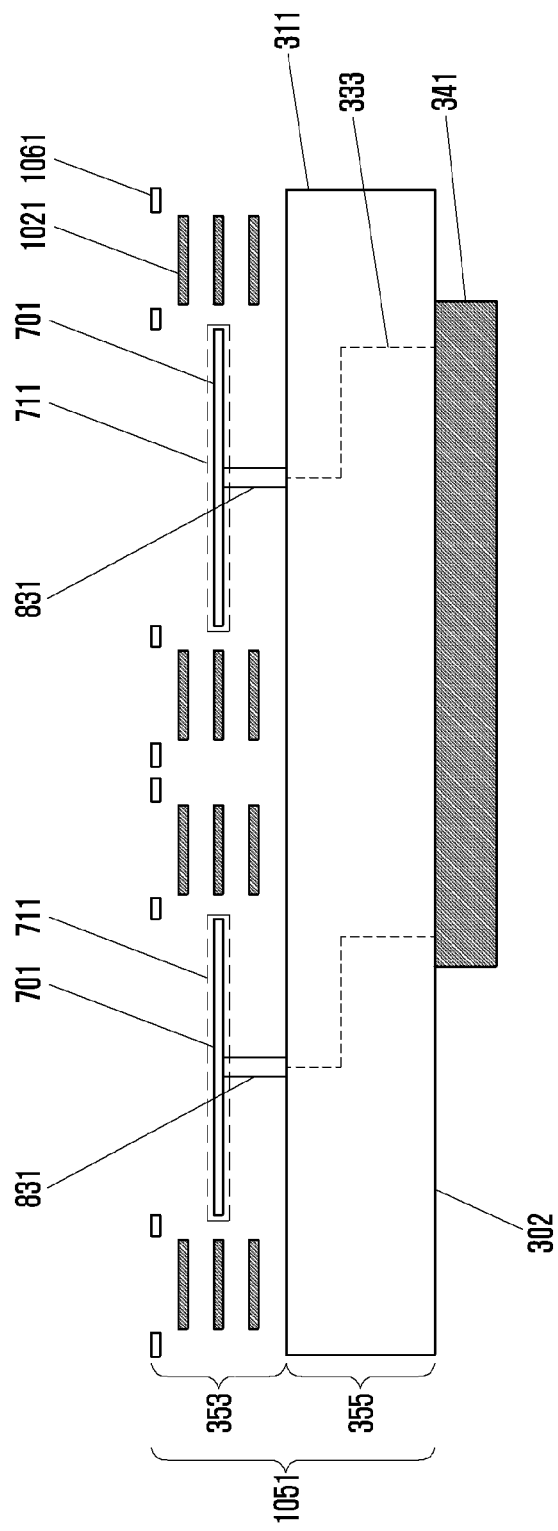
FIG. 11 is a diagram illustrating an embodiment of a section of the PCB disclosed in FIG. 10 take along B.

FIG. 11 is a diagram illustrating an embodiment of a section of the PCB disclosed in FIG. 10 take along B.

The structure of the PCB 1051 disclosed in FIG. 11 may be identical or similar to that of the PCB disclosed in FIG. 7 except that the second electroconductive patterns 1061 may be formed in ring shapes.

Figure 12:
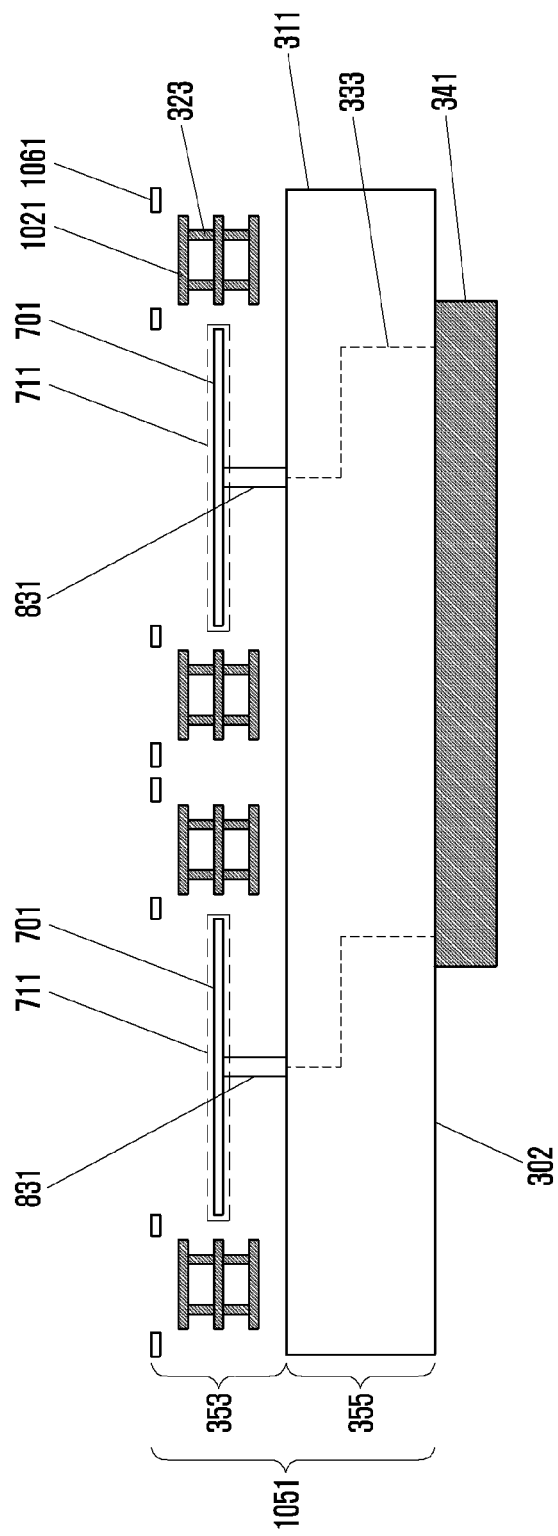
FIG. 12 is a diagram illustrating a section of a PCB having ring-shaped second electroconductive patterns and having vias formed between first electroconductive patterns.

FIG. 12 is a diagram illustrating a section of a PCB having ring-shaped second electroconductive patterns and having vias formed between first electroconductive patterns.

According to various embodiments of the present disclosure, the first electroconductive patterns 1021 may be connected to each other through vias 323. For example, a first electroconductive pattern 1021 formed on a layer may be connected through a via 323 to another first electroconductive pattern formed on a layer laminated above or below the layer, on which the first electroconductive layer is formed, so as to overlap with the first electroconductive pattern 1021. For example, the first electroconductive patterns 1021 arranged on respective layers may be connected to each other through vias 323, thereby preventing the PCB from bending at a high temperature.

The structure of the PCB 1051 disclosed in FIG. 12 may be identical or similar to that of the PCB disclosed in FIG. 11 except that vias may be formed between the first electroconductive patterns 1021.

FIG. 13A to FIG. 13E illustrate an embodiment in which a plurality of first electroconductive patterns 321 are formed on a PCB.

Figure 13A:
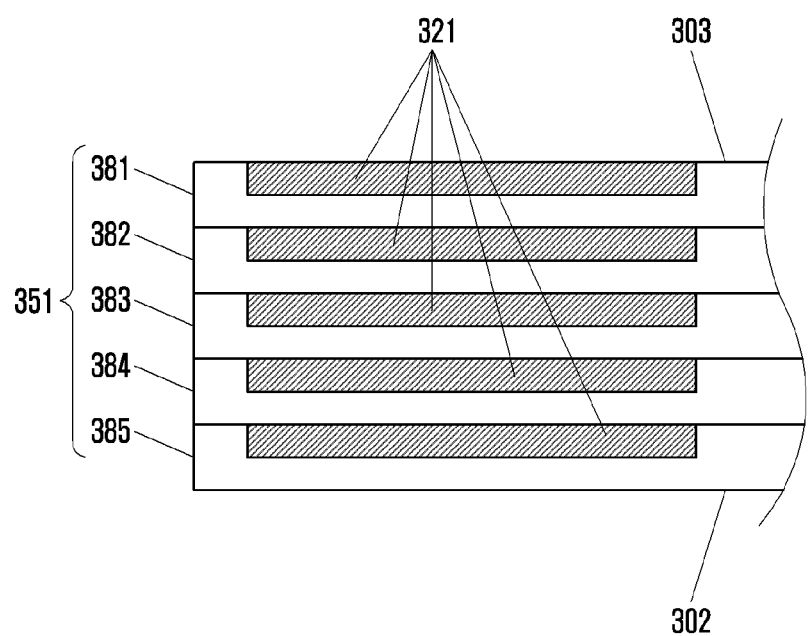
FIG. 13A-13E illustrate an embodiment in which a plurality of first electroconductive patterns 321 are formed on a PCB.

Referring to FIG. 13A, there is illustrated a case in which layers having no first electroconductive patterns 321 formed thereon do not exist between layers 381, 382, 383, 384, and 385 of a PCB 351, on which first electroconductive patterns 321 are formed in the same shape. Respective first electroconductive patterns 321 may be formed to overlap with each other when seen from above the second surface 303 of the PCB.

Figure 13B:
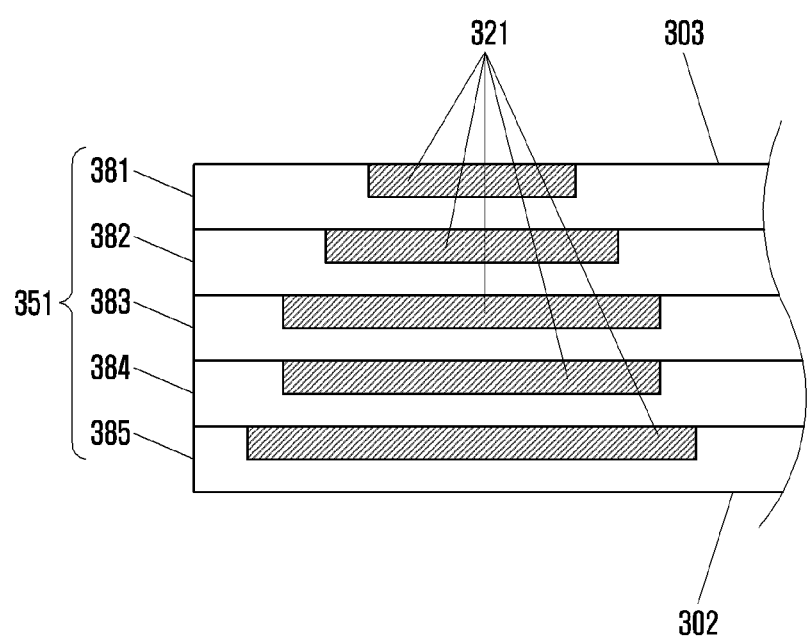

Referring to FIG. 13B, there is illustrated a case in which first electroconductive patterns 321 are formed on layers of a PCB 351 in different shapes. For example, the area of the first electroconductive pattern formed on the first layer 381 may be the smallest, and the area of the first electroconductive pattern formed on the second layer 385 may be the largest. According to an embodiment, even if the first electroconductive patterns 321 formed on respective layers 381, 382, 383, 384, and 385 may have different sizes or shapes, the center axes of the first electroconductive patterns formed on respective layers 381, 382, 383, 384, and 385 may coincide.

Figure 13C:
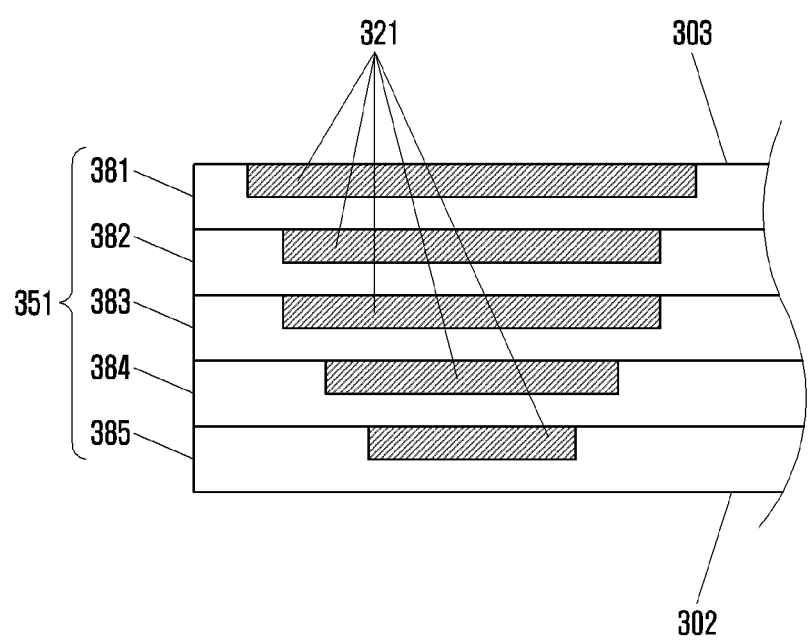

Referring to FIG. 13C, there is illustrated a case in which first electroconductive patterns 321 are formed on layers of a PCB 351 in different shapes. For example, the area of the first electroconductive pattern formed on the first layer 381 is the largest, and the area of the first electroconductive pattern formed on the second layer 385 is the smallest. According to an embodiment, the center axes of the first electroconductive patterns formed on respective layers 381, 382, 383, 384, and 385 may coincide.

Figure 13D:
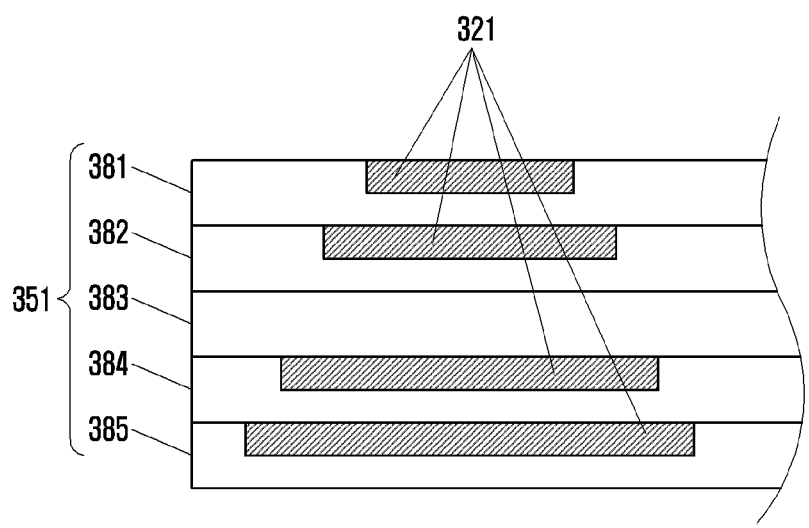

Referring to FIG. 13D, there is illustrated a case in which first electroconductive patterns 321 are formed on some layers 381, 382, 384, and 385 of a PCB 351 in different shapes. For example, no first electroconductive pattern may be formed on the third layer 383. As another example, the area of the first electroconductive pattern formed on the first layer 381 may be the smallest, and the area of the first electroconductive pattern formed on the second layer 385 may be the largest.

Figure 13E:
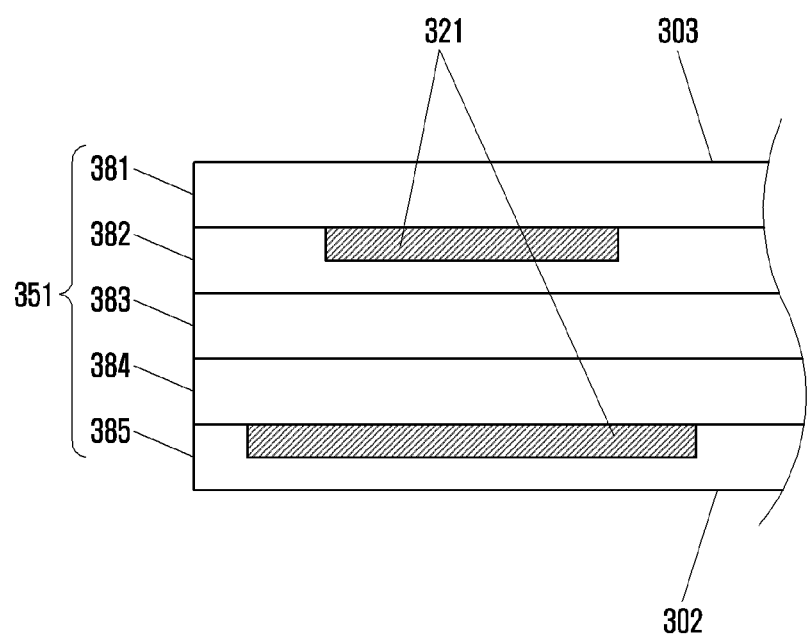

Referring to FIG. 13E, there is illustrated a case in which first electroconductive patterns 321 are formed on some layers 382 and 385 of a PCB 351 in different shapes. For example, electroconductive patterns may be formed only on the fourth layer 382 and on the second layer 385, and the area of the first electroconductive pattern formed on the fourth layer 382 may be smaller than the area of the first electroconductive pattern formed on the second layer 385. According to an embodiment, the center axes of the first electroconductive patterns formed on the fourth layer 382 and the second layer 385 may coincide.

FIG. 14A to FIG. 14D illustrate a case in which an antenna element and a plurality of first electroconductive patterns are formed on a PCB.

Figure 14A:
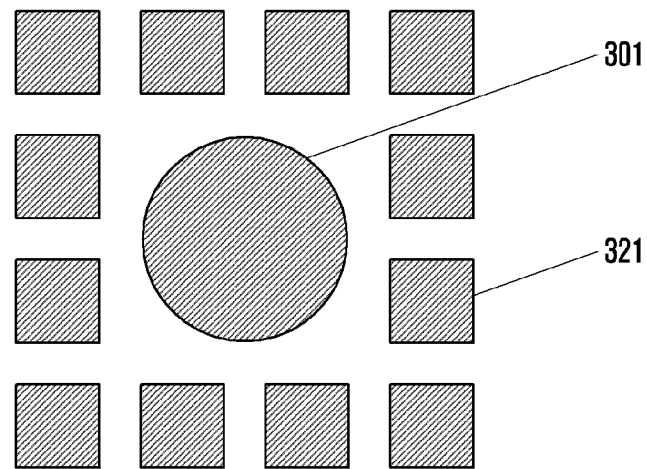
FIG. 14A-14D illustrate a case in which an antenna element and a plurality of first electroconductive patterns are formed on a PCB.

Referring to FIG. 14A, there is illustrated a case in which first electroconductive patterns 321 are formed in quadrangular shapes at a uniform interval on a PCB along the outer periphery of an antenna element 301. For example, twelve first electroconductive patterns 321 may be formed on a single layer or on a plurality of layers along the outer periphery of the antenna element 301.

Figure 14B:
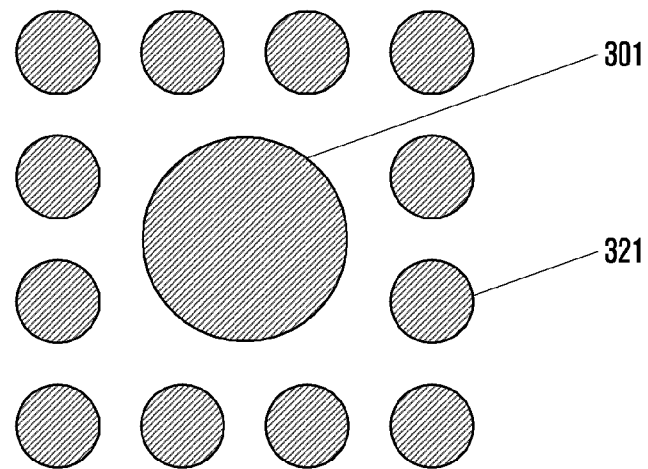

Referring to FIG. 14B, there is illustrated a case in which first electroconductive patterns 321 are formed in circular shapes at a uniform interval on a PCB along the outer periphery of an antenna element 301. For example, twelve first electroconductive patterns 321 may be formed on a single layer or on a plurality of layers along the outer periphery of the antenna element 301.

Figure 14C:
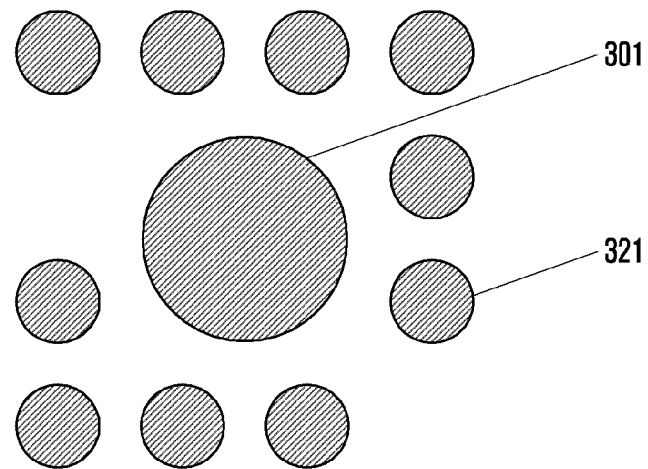

Referring to FIG. 14C, there is illustrated a case in which first electroconductive patterns 321 are formed on a PCB in circular shapes at non-uniform intervals along the outer periphery of an antenna element 301. For example, ten first electroconductive patterns 321 may be formed on a single layer or on a plurality of layers along the outer periphery of an antenna element 301, and some first electroconductive patterns 321 may be omitted, making the intervals between respective first electroconductive patterns 321 non-uniform.

Figure 14D:
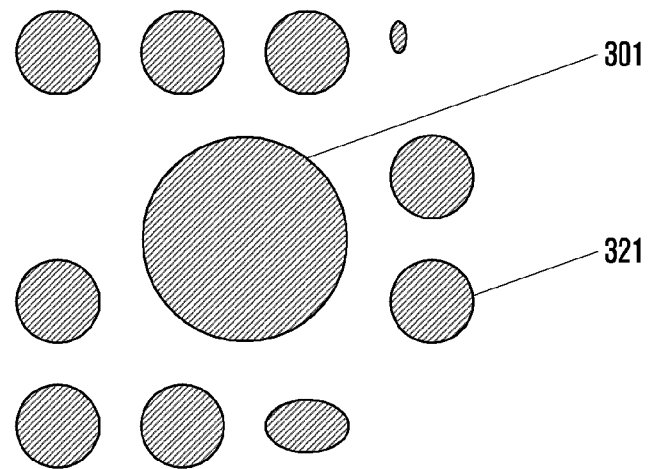

Referring to FIG. 14D, there is illustrated a case in which first electroconductive patterns 321 are formed on a PCB in different shapes at different intervals along the outer periphery of an antenna element 301. For example, respective first electroconductive patterns may have different shapes. As another example, some first electroconductive patterns may have circular shapes, and some first electroconductive patterns may have elliptical shapes with different areas. According to an embodiment, the intervals between respective first electroconductive patterns 321 may be non-uniform.

Figure 15:
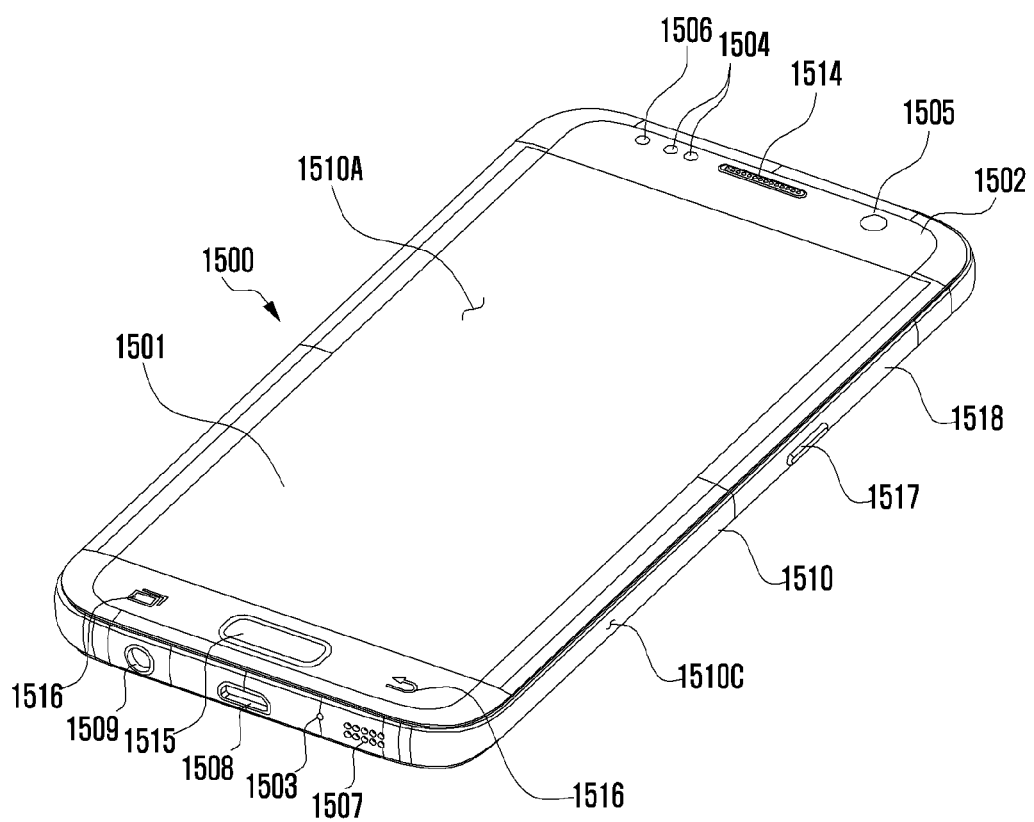
FIG. 15 is a front perspective view illustrating a mobile electronic device according to an embodiment.

FIG. 15 is a front perspective view of a mobile electronic device according to an embodiment.

Figure 16:
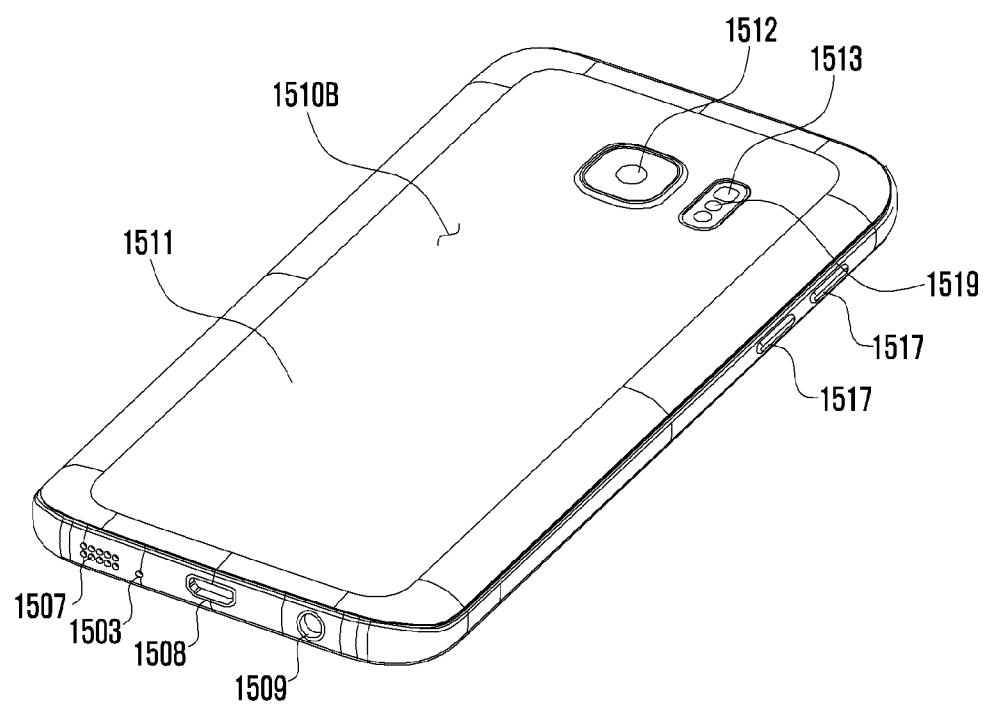
FIG. 16 is a rear perspective view illustrating the electronic device of FIG. 15.

FIG. 16 is a rear perspective view of the electronic device of FIG. 15.

Referring to FIG. 15 and FIG. 16, an electronic device 1500 according to an embodiment may include a housing 1510 including a first surface (or front surface) 1510A, a second surface (or rear surface) 1510B, and a side surface 1510C surrounding the space between the first surface 1510A and the second surface 1510B. In another embodiment (not illustrated), the housing may also refer to a structure that forms at least some of the first surface 1510A, the second surface 1510B, and the side surface 1510C of FIG. 15.

According to an embodiment, the first surface 1510A may be formed by a first plate (or front plate) 1502 (for example, a glass plate or a polymer plate including various coating layers), at least a part of which is substantially transparent.

According to an embodiment, the second surface 1510B may be formed by a second plate (or rear plate) 1511. The second plate 1511 may be formed, for example, by coated or colored glass, ceramic, a polymer, a metal (for example, aluminum, stainless steel (STS), or magnesium), or a combination of at least two selected from the above materials.

According to an embodiment, the side surface 1510C may be formed by a side bezel structure (or "side member") 1518 which is coupled to the first plate 1502 and to the second plate 1511, and which includes a metal and/or a polymer. According to an embodiment, the side member 1518 may include at least one non-electroconductive materials 1520 and 1521 for transmitting and/or receiving signals according to an embodiment. In some embodiments, the second plate 1511 and the side bezel structure 1518 may be integrally formed and may include an identical material (for example, a metallic material such as aluminum).

According to an embodiment, the electronic device 1500 may include at least one selected from a display 1501, audio modules 1503, 1507, and 1514, sensor modules 1504 and 1519, camera modules 1505, 1512, and 1513, key input devices 1515, 1516, 1517, an indicator 1506, and connector holes 1508 and 1509. In some embodiments, at least one of the constituent elements of the electronic device 1500 (for example, the key input devices 1515, 1516, and 1517 or the indicator 1506) may be omitted, or the electronic device 1500 may additionally include a different constituent element.

The display 1501 may be exposed through a corresponding part of the first plate 1502, for example. The display 1501 may be coupled to or arranged adjacent to a touch sensing circuit, a pressure sensor capable of measuring the intensity (pressure) of a touch, and/or a digitizer for detecting a stylus pen of a magnetic field type.

According to an embodiment, the audio modules 1503, 1507, and 1514 may include a microphone hole 1503 and speaker holes 1507 and 1514. A microphone may be arranged inside the microphone hole 1503 so as to acquire external sounds, and, in some embodiments, a plurality of microphones may be arranged therein such that the direction of sounds can be sensed. The speaker holes 1507 and 1514 may include an external speaker hole 1507 and a speech receiver hole 1514. In some embodiments, the speaker holes 1507 and 1514 and the microphone hole 1503 may be implemented as a single hole, or a speaker may be included (for example, a piezoelectric speaker) without the speaker holes 1507 and 1514.

According to an embodiment, the sensor modules 1504 and 1519 may generate an electric signal or a data value corresponding to the internal operating condition of the electronic device 1500 or corresponding to an external environmental condition. The sensor modules 1504 and 1519 may include, for example, a first sensor module 1504 (for example, a proximity sensor) arranged on the first surface 1510A of the housing 1510, and/or a second sensor module (not illustrated) (for example, a fingerprint sensor), and/or a third sensor module 1519 (for example, an HRM sensor) arranged on the second surface 1510B of the housing 1510.

According to an embodiment, the fingerprint sensor may be arranged not only on the first surface 1510A (for example, on the home key button 1515) of the housing 1510, but also on the second surface 1510B thereof. The electronic device 1500 may further include a sensor module not illustrated, for example, at least one selected from a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, and a luminance sensor 1504.

According to an embodiment, the camera modules 1505, 1512, and 1513 may include a first camera device arranged on the first surface 1510A of the electronic device 1500, a second camera device 1512 arranged on the second surface 1510B thereof, and/or a flash 1513. The camera modules 1505 and 1512 may include a single lens or a plurality of lenses, an image sensor, and/or an image signal processor. The flash 1513 may include a light-emitting diode or a xenon lamp, for example. In some embodiments, two or more lenses (a wide-angle lens and a telephoto lens) and image sensors may be arranged on one surface of the electronic device 1500.

According to an embodiment, the key input devices 1515, 1516, and 1517 may include a home key button 1515 arranged on the first surface 1510A of the housing 1510, a touch pad 1516 arranged on the periphery of the home key button 1515, and/or a side key button 1517 arranged on the side surface 1510C of the housing 1510. In another embodiment, the electronic device 1500 may not include some or all of the above-mentioned key input devices 1515, 1516, and 1517, and the key input devices 1515, 1516, and 1517 that are not included may be implemented on the display 1501 in a different type, for example, as soft keys.

According to an embodiment, the indicator 1506 may be arranged on the first surface 1510A of the housing 1510, for example. The indicator 1506 may provide information regarding the condition of the electronic device 1500 in a light type, for example, and may include an LED.

According to an embodiment, the connector holes 1508 and 1509 may include a first connector hole 1508 capable of containing a connector (for example, a USB connector) for transmitting/receiving power and/or data to/from an external electronic device and/or a second connector hole (for example, an earphone jack) 1509 capable of containing a connector for transmitting/receiving audio signals to/from the external electronic device.

Figure 17:
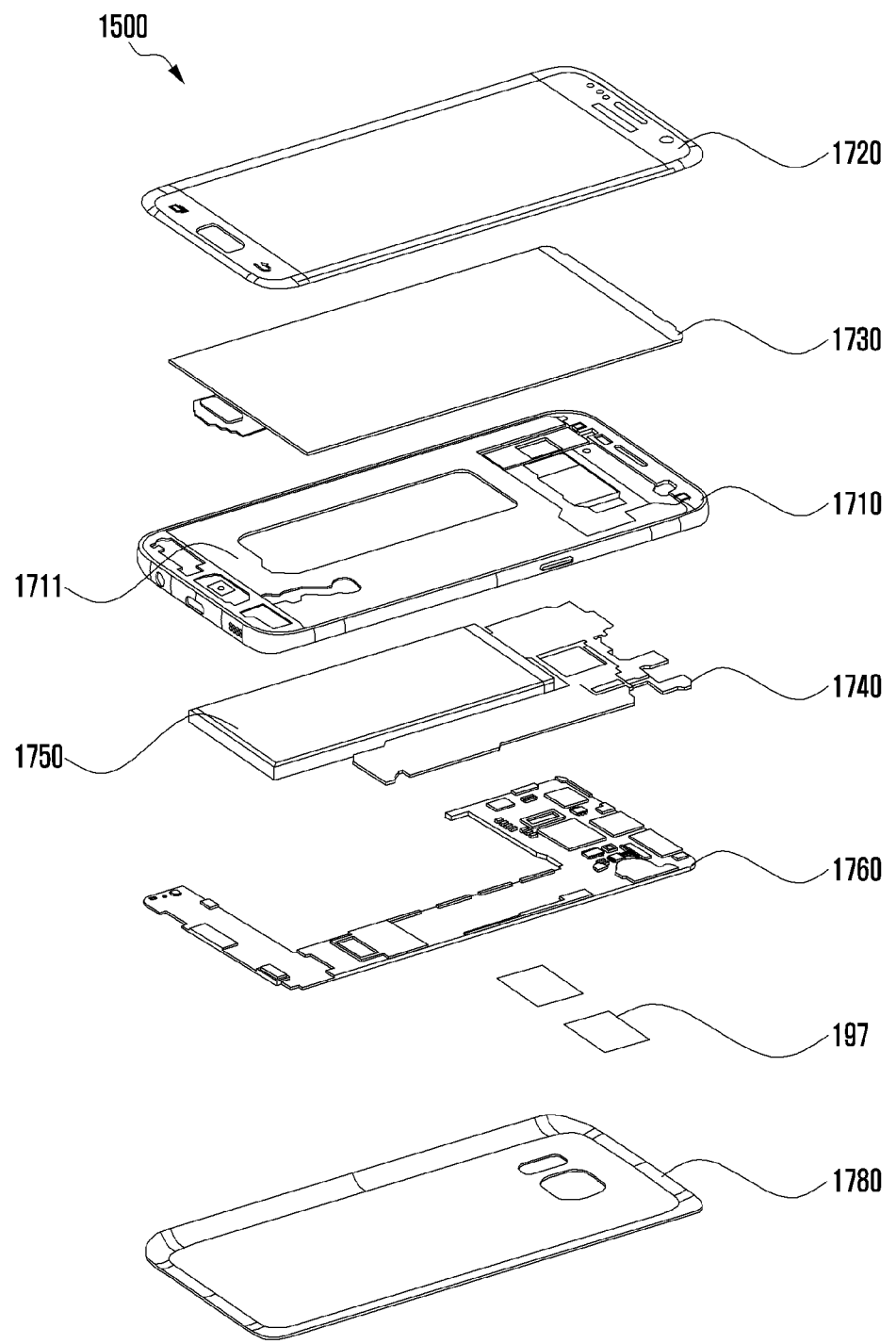
FIG. 17 is an exploded perspective view illustrating the electronic device of FIG. 15.

FIG. 17 is an exploded perspective view of the electronic device of FIG. 15.

Referring to FIG. 17, the electronic device 1500 may include a side bezel structure 1710, a first support member 1711 (for example, a bracket), a first plate 1720, a display 1730, a substrate 1740, a battery 1750, a second support member 1760 (for example, a rear case), the antenna module 197, and a second plate 1780. In some embodiments, at least one of the constituent elements of the electronic device 1500 (for example, the first support member 1711 or the second support member 1760) may be omitted, or the electronic device 1500 may additionally include a different constituent element. At least one of the constituent elements of the electronic device 1500 may be identical or similar to at least one of the constituent elements of the electronic device 1500 of FIG. 15 or FIG. 16, and repeated description thereof will be omitted herein.

The first support member 1711 may be arranged inside the electronic device 1500 and connected to the side bezel structure 1710, or may be formed integrally with the side bezel structure 1710. The first support member 1711 may be made of, for example, a metallic material and/or a nonmetal material (for example, a polymer). The display 1730 may be coupled to one surface of the first support member 1711, and the substrate 1740 may be coupled to the other surface thereof. A processor, a memory, and/or an interface may be mounted on the substrate 1740. According to an embodiment, the substrate 1740 may be a printed circuit board (PCB), particularly a main PCB. The processor may include, for example, one or more selected from a central processing device, an application processor, a graphic processing device, an image signal processor, a sensor hub processor, and a communication processor.

The memory may include, for example, a volatile memory or a nonvolatile memory.

The interface may include, for example, a high definition multimedia interface (HDMI), a universal serial bus (USB) interface, an SD card interface, and/or an audio interface. The interface may, for example, connect the electronic device 1500 to an external electronic device electrically or physically, and may include a USB connector, an SD card/MMC connector, or an audio connector.

The battery 1750 is a device for supplying power to at least constituent element of the electronic device 1500, and may include a primary battery that cannot be recharged, a rechargeable secondary battery, or a fuel cell, for example. At least a part of the battery 1750 may be arranged on substantially the same plane with the PCB, for example. The battery 1750 may be integrally arranged inside the electronic device 1500, or may be arranged such that the same can be attached to/detached from the electronic device 1500.

According to an embodiment, the antenna module 197 may be arranged between the second plate 1780 and the battery 1750. According to an embodiment, the antenna module 197 may be a mmWare module. The antenna module 197 may transmit and/or receive a signal in a mmWare band or may process a transmitted signal or a received signal. According to an embodiment, the electronic device 1500 may include at least one antenna module 197. According to an embodiment, the electronic device 1500 may include a plurality of antenna modules 197. The mmWare band may include a frequency band between 20 GHz and 100 GHz. According to an embodiment, the antenna module 197 may include a plurality of antenna elements for transmitting and/or receiving a signal in the mmWare band.

An electronic device according to various embodiments of the present disclosure may include: a housing 1510 including a first plate 1502 and a second plate 1511 facing in a direction opposite to the first plate 1502; a printed circuit board (PCB) having a first surface 1521 facing the first plate 1502 and having a second surface 1522 facing the second plate 1511; and a communication circuit 1530 arranged inside the housing. The communication circuit 1530 may be electrically connected to the antenna elements and may transmit/receive a frequency of 20 GHz to 100 GHz.

The PCB may include: a plurality of insulating layers laminated on each other between the first surface 1521 and the second surface 1522; an antenna element 701 arranged in a first region 711 above the second surface of the PCB or between a first pair 721 of insulating layers of the PCB, when seen from above the second surface of the PCB; and a plurality of first electroconductive patterns 321 arranged in a second region that at least surrounds one surface of the first region 711 between a first pair 721 of directly adjacent layers of the insulating layers of the PCB or between a second pair 731 of directly adjacent layers of the insulating layers, when seen from above the second surface of the PCB. The antenna element 701 may be physically separated from the first electroconductive patterns 321.

According to an embodiment, the electrical path length of each of the first electroconductive patterns 321 may be shorter than the electric path length of the antenna element 701.

According to an embodiment, the first electroconductive patterns 321 may have identical shapes.

According to an embodiment, the first electroconductive patterns 321 may include at least one selected from a square shape, a rectangular shape, and a circular shape.

According to an embodiment, the PCB may further include a plurality of second electroconductive patterns 361 arranged in a third region that overlaps with the second region and surrounds at least a part of the first region 711, on the second surface of the PCB or between a third pair 741 of insulating layers, when seen from above the second surface of the PCB. Each of the second electroconductive patterns 361 and the antenna element 701 may be physically separated from each other.

According to an embodiment, the electric path length of each of the second electroconductive patterns 361 may be shorter than the electrical path length of the antenna element 701 and longer than the electric path length of the first electroconductive patterns 321.

According to an embodiment, the plurality of second electroconductive patterns 361 may include at least one selected from a square shape, a rectangular shape, a circular shape, a square ring shape, a rectangular ring shape, and a circular ring shape.

According to an embodiment, the PCB may not include an electroconductive material between the first region 711 and the second pair 731 of directly adjacent layers of the insulating layers.

According to an embodiment, the PCB may further include a ground layer 311 arranged between a pair of insulating layers closer to the first surface 1521 than the first pair 721 of directly adjacent layers of the insulating layers or the second pair 731 of directly adjacent layers of the insulating layers, when seen from above the second surface of the PCB, such that the ground layer 311 substantially extends across the PCB.

According to an embodiment, the communication circuit 1530 may be arranged on the first surface 1521 of the PCB.

A PCB 751 according to various embodiments of the present disclosure may include: at least one antenna element 701 arranged on a surface 303 of the PCB or between the insulating layers of the PCB; a plurality of first electroconductive patterns 321 arranged along an outer periphery of the antenna element 750 between the insulating layers of the PCB; and a communication circuit 341 arranged to be electrically connected to the antenna element 701 and to be able to transmit/receive a frequency of 20 GHz to 100 GHz. The first electroconductive patterns 321 may be electrically insulated from each other.

According to an embodiment, the PCB may further include a plurality of second electroconductive patterns 361 arranged to overlap with the first electroconductive patterns 321 along the outer periphery of the antenna element 701 on a surface 303 of the PCB or between the insulating layers of the PCB. Each of the second electroconductive patterns 361 and the antenna element 701 may be electrically insulated from each other.

According to an embodiment, the PCB may not include an electroconductive material in a region 711 that overlaps with the outer periphery of the antenna element 701 between a surface 303 of the PCB and an insulating layer on which the antenna element 701 is arranged.

According to an embodiment, the PCB may further include at least one ground layer 311 arranged on a layer below the layer on which the antenna element 701 and the plurality of first electroconductive patterns 321 are formed.

According to an embodiment, the communication circuit 341 may be arranged on a back surface 302 of a surface 303 of the PCB.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Although the present disclosure has been described with various embodiments, various changes and modifications may be suggested to one skilled in the art. It is intended that the present disclosure encompass such changes and modifications as fall within the scope of the appended claims.

What is claimed is:
1. An electronic device comprising:
   a housing comprising a first plate and a second plate facing in a direction opposite to the first plate;

a communication circuit arranged inside the housing and configured to transmit and receive using a frequency of 20 GHz to 100 GHz, and a printed circuit board comprising:
  a first surface facing the first plate,
  a second surface facing the second plate; and
  a plurality of insulating layers laminated on each other between the first surface and the second surface;
  an antenna element arranged in a first region above the second surface of the printed circuit board or between a first pair of insulating layers of the printed circuit board when seen from above the second surface of the printed circuit board; and
  a plurality of first electroconductive patterns arranged in a second region that surrounds one surface of the first region between a first pair of directly adjacent layers of the insulating layers of the printed circuit board or between a second pair of directly adjacent layers of the insulating layers when seen from above the second surface of the printed circuit board, wherein the second region does not overlap with the first region when seen from above the second surface, and none of the plurality of first electroconductive patterns overlap with the antenna element when seen from above the surface, and each of the plurality of first electroconductive patterns that overlap with another of the first electroconductive patterns, when seen from above the surface, shares a central axis that passes through each such overlapping first electroconductive pattern,
  wherein:
    the antenna element is physically separated from the first electroconductive patterns, and
    the communication circuit is electrically connected to the antenna element.

2. The electronic device of claim 1, wherein an electrical path length of each of the first electroconductive patterns is shorter than an electric path length of the antenna element.

3. The electronic device of claim 1, wherein each of the first electroconductive patterns comprise identical shapes.

4. The electronic device of claim 1, wherein each of the first electroconductive patterns comprise at least one selected from a square shape, a rectangular shape, or a circular shape.

5. The electronic device of claim 1, wherein:
  the printed circuit board further comprises a plurality of second electroconductive patterns arranged in a third region that overlaps with the second region and surrounds at least a part of the first region, on the second surface of the printed circuit board or between a third pair of insulating layers, when seen from above the second surface of the printed circuit board, and
  each of the second electroconductive patterns and the antenna element are physically separated from each other.

6. The electronic device of claim 5, wherein an electric path length of each of the second electroconductive patterns is shorter than an electrical path length of the antenna element and longer than an electric path length of the first electroconductive patterns.

7. The electronic device of claim 6, wherein each of the plurality of second electroconductive patterns comprise at least one selected from a square shape, a rectangular shape, a circular shape, a square ring shape, a rectangular ring shape, or a circular ring shape.

8. The electronic device of claim 1, wherein an electroconductive material is excluded from between the first region and the second pair of directly adjacent layers of the insulating layers.

9. The electronic device of claim 1, wherein the printed circuit board further comprises a ground layer arranged between a pair of insulating layers closer to the first surface than the first pair of directly adjacent layers of the insulating layers or the second pair of directly adjacent layers of the insulating layers, when seen from above the second surface of the printed circuit board, such that the ground layer substantially extends across the printed circuit board.

10. The electronic device of claim 1, wherein the communication circuit is arranged on the first surface of the printed circuit board.

11. A printed circuit board comprising:
  a plurality of insulating layers laminated on each other;
  at least one antenna element arranged on a surface of the printed circuit board or between the insulating layers of the printed circuit board;
  a plurality of first electroconductive patterns arranged along an outer periphery of the antenna element between the insulating layers of the printed circuit board and electrically insulated from each other, such that none of the plurality of first electroconductive patterns overlap with the antenna element when seen from above the surface, and such that each of the plurality of first electroconductive patterns that overlap with another of the first electroconductive patterns, when seen from above the surface, shares a central axis that passes through each such overlapping first electroconductive pattern; and
  a communication circuit arranged to be electrically connected to the antenna element and to be able to transmit/receive a frequency of 20 GHz to 100 GHz.

12. The printed circuit board of claim 11, wherein an electrical path length of each of the first electroconductive patterns is shorter than an electric path length of the antenna element.

13. The printed circuit board of claim 11, wherein each of the first electroconductive patterns comprises an identical shape.

14. The printed circuit board of claim 11, wherein each of the plurality of first electroconductive patterns comprise a square shape, a rectangular shape, or a circular shape.

15. The printed circuit board of claim 11, wherein:
  the printed circuit board further comprises a plurality of second electroconductive patterns arranged to overlap with the first electroconductive patterns along the outer periphery of the antenna element on a surface of the printed circuit board or between the insulating layers of the printed circuit board, and
  each of the second electroconductive patterns and the antenna element are electrically insulated from each other.

16. The printed circuit board of claim 15, wherein an electric path length of each of the second electroconductive patterns is shorter than an electrical path length of the antenna element and longer than an electric path length of the first electroconductive patterns.

17. The printed circuit board of claim 16, wherein each of the plurality of second electroconductive patterns comprise a square shape, a rectangular shape, a circular shape, a square ring shape, a rectangular ring shape, or a circular ring shape.

18. The printed circuit board of claim 11, wherein an electroconductive material is excluded from a region that overlaps with the outer periphery of the antenna element between a surface of the printed circuit board and an insulating layer on which the antenna element is arranged.

19. The printed circuit board of claim 11, further comprising at least one ground layer arranged on a layer below the layer on which the antenna element and the plurality of first electroconductive patterns are formed.

20. The printed circuit board of claim 11, wherein the communication circuit is arranged on a back surface of a surface of the printed circuit board.

* * * * *